United States Patent
Parrish

(10) Patent No.: US 6,686,732 B2
(45) Date of Patent: Feb. 3, 2004

(54) LOW-COST TESTER INTERFACE MODULE

(75) Inventor: Frank Parrish, Simi Valley, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/026,861

(22) Filed: Dec. 20, 2001

(65) Prior Publication Data

US 2003/0117129 A1 Jun. 26, 2003

(51) Int. Cl.[7] .............................................. G01R 31/02
(52) U.S. Cl. ...................... 324/158.1; 324/755; 324/761
(58) Field of Search ................................ 324/755, 765, 324/158.1, 758, 754, 763; 439/581, 66

(56) References Cited

U.S. PATENT DOCUMENTS

| | | | | |
|---|---|---|---|---|
| 4,824,400 A | * | 4/1989 | Spinner | 439/578 |
| 4,922,325 A | * | 5/1990 | Smeltz, Jr. | 257/686 |
| 5,376,882 A | * | 12/1994 | Johnson | 324/158.1 |
| 5,800,184 A | * | 9/1998 | Lopergolo et al. | 439/66 |
| 6,166,615 A | * | 12/2000 | Winslow et al. | 333/260 |
| 6,264,476 B1 | * | 7/2001 | Li et al. | 439/66 |
| RE37,368 E | * | 9/2001 | Huppenthal et al. | 439/581 |
| 6,420,888 B1 | * | 7/2002 | Griffin et al. | 324/754 |

FOREIGN PATENT DOCUMENTS

WO    WO 02/27337 A2  *  9/2000  ........... G01R/31/00

* cited by examiner

Primary Examiner—Kamand Cuneo
Assistant Examiner—Jimmy Nguyen
(74) Attorney, Agent, or Firm—Lance Kreisman

(57) ABSTRACT

An interface module for connecting a plurality of signal paths from a first electronic assembly to a second electronic assembly is disclosed. The interface module includes a plurality of coaxial cables having distal ends adapted for coupling to the first electronic assembly and proximal ends, each cable having a shield conductor and a center conductor. A stiffener formed with a plurality of throughbores receives the proximal ends of the plurality of signal cables, the stiffener having a flat termination side at one end of the plurality of throughbores. The module further includes a signal transition assembly having a flat substrate bonded to the stiffener termination side. The substrate includes respective opposite sides and is formed with spaced-apart signal paths and ground paths extending from one side to the other side. Each center conductor and shield conductor are electrically coupled to the signal paths and ground paths and mounted to the signal transition assembly to minimize relative axial displacement.

17 Claims, 3 Drawing Sheets

LOW-COST TESTER INTERFACE MODULE

FIELD OF THE INVENTION

The invention relates generally to multi-conductor routing schemes, and more particularly an interface module for a high-performance semiconductor tester interface.

BACKGROUND OF THE INVENTION

Sophisticated electronic assemblies often employ dense arrays of electrical conductors to deliver signals from one area to another. Routing large groups of conductors in an efficient and organized manner often proves problematic for a variety of reasons. The overall assembly cost, formfactor (size), conductor pitch and complexity all must typically be taken into account to determine a suitable routing method.

For high-performance semiconductor testers, tester signals up to several gigahertz are funneled and delivered from relatively large circuit boards known as channel cards, to the leads of a very compact device-under-test. Often, several thousand signal paths provide the signal delivery scheme between the DUT and the tester electronics. In order to preserve fidelity for such high-frequency signals, the signal paths are constructed to provide as close to a matched fifty-ohm impedance environment as possible. Providing such an environment with a large number of signal paths is a difficult endeavor.

One proposal for efficiently routing high-performance signals in an ATE interface is disclosed in U.S. patent application Ser. No. 09/676,041, entitled "Tester Interface Module", filed Sep. 28, 2000, incorporated herein by reference and assigned to the assignee of the present invention. Generally, this proposal discloses a harness assembly for interfacing a plurality of semiconductor pin electronics circuits to a compliant interconnect array disposed on a device-interface-board. The harness assembly includes a plurality of coaxial cables having shield and center conductor distal tips that terminate in a housing. The distal tips of the cables are formed to define an interface engagement plane.

While the proposal above is beneficial for its intended purposes, the shield and center conductor contact structures are susceptible to a problem known as "pistoning", due to the direct contact of the structures to the compliant array, or interposer and from bending of the cable. Pistoning involves the relative axial displacement of the center conductor with respect to the shield conductor. In some instances, if the pistoning problem is too great, the contact surfaces of the shield/signal conductors may be unable to touch the compliant interposer or distort the 50-ohm signal. Complex contact configurations could address the problem, but at an undesirable cost when considering the thousands of connections involved.

What is needed and heretofore unavailable is a tester interface module capable of delivering high fidelity signals at low cost. The tester interface module of the present invention satisfies these needs.

SUMMARY OF THE INVENTION

The interface module of the present invention provides a cost-effective and straightforward way to route dense arrays of high frequency conductors with minimal signal degradation.

To realize the foregoing advantages, the invention in one form comprises an interface module for connecting a plurality of signal paths from a first electronic assembly to a second electronic assembly. The interface module includes a plurality of coaxial cables having distal ends adapted for coupling to the first electronic assembly and proximal ends, each cable having a shield conductor and a center conductor. A stiffener formed with a plurality of throughbores receives the proximal ends of the plurality of signal cables, the stiffener having a flat termination side at one end of the plurality of throughbores. The module further includes a signal transition assembly having a flat substrate bonded to the stiffener termination side. The substrate includes respective opposite sides and is formed with spaced-apart signal paths and ground paths extending from one side to the other side. Each center conductor and shield conductor are electrically coupled to the signal paths and ground paths and mounted to the signal transition assembly to minimize relative axial displacement.

In another form, the invention comprises an ATE interface for coupling high-frequency tester channels to a device-under-test. The interface includes an interface module having a plurality of coaxial cables having distal ends adapted for coupling to the first electronic assembly and proximal ends, each cable having a shield conductor and a center conductor. A stiffener formed with a plurality of throughbores receives the proximal ends of the plurality of signal cables, the stiffener having a flat termination side at one end of the plurality of throughbores. The module further includes a signal transition assembly including a flat substrate bonded to the stiffener termination side. The substrate includes respective opposite sides and formed with spaced-apart signal paths and ground paths extending from one side to the other side. Each center conductor and shield are electrically coupled to the signal paths and ground paths and mounted to the signal transition assembly to minimize relative axial displacement. The interface further includes a device-interface-board adapted for mounting the device-under-test, and a compliant interposer disposed between the signal transition assembly and the device-interface-board.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
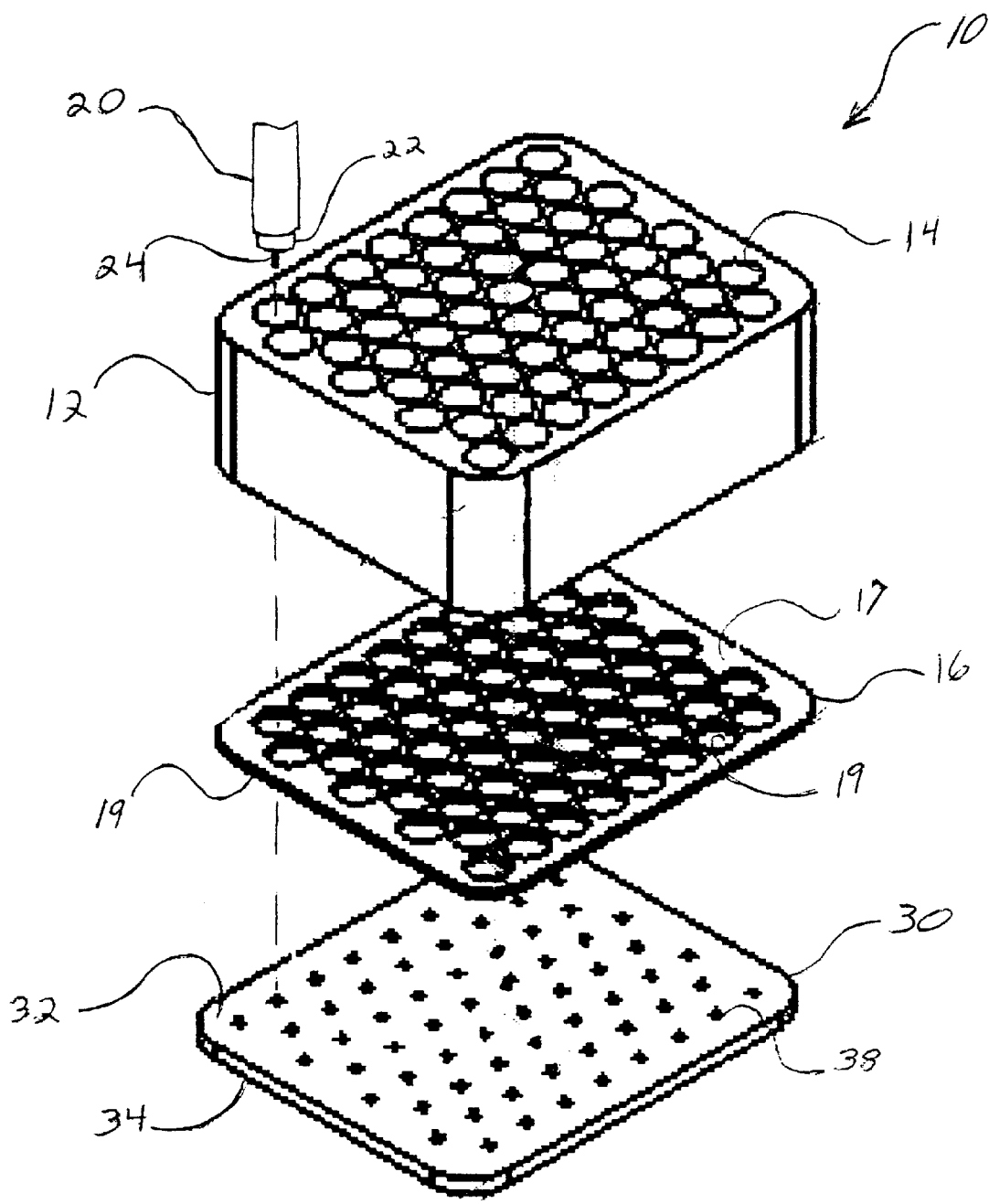
FIG. 1 is an exploded perspective view of an interface module according to one form of the present invention.

Referring now to FIG. 1, the interface module according to one form of the present invention, generally designated 10, employs a stiffener 12 that cooperates with a signal transition assembly 30 to prevent the respective shield and center conductors 22 and 24 of a plurality of coaxial cables 20 from "pistoning." This enables the module to provide a reliable and robust connection scheme for, as an example, an automatic test equipment interface.

Figure 2:
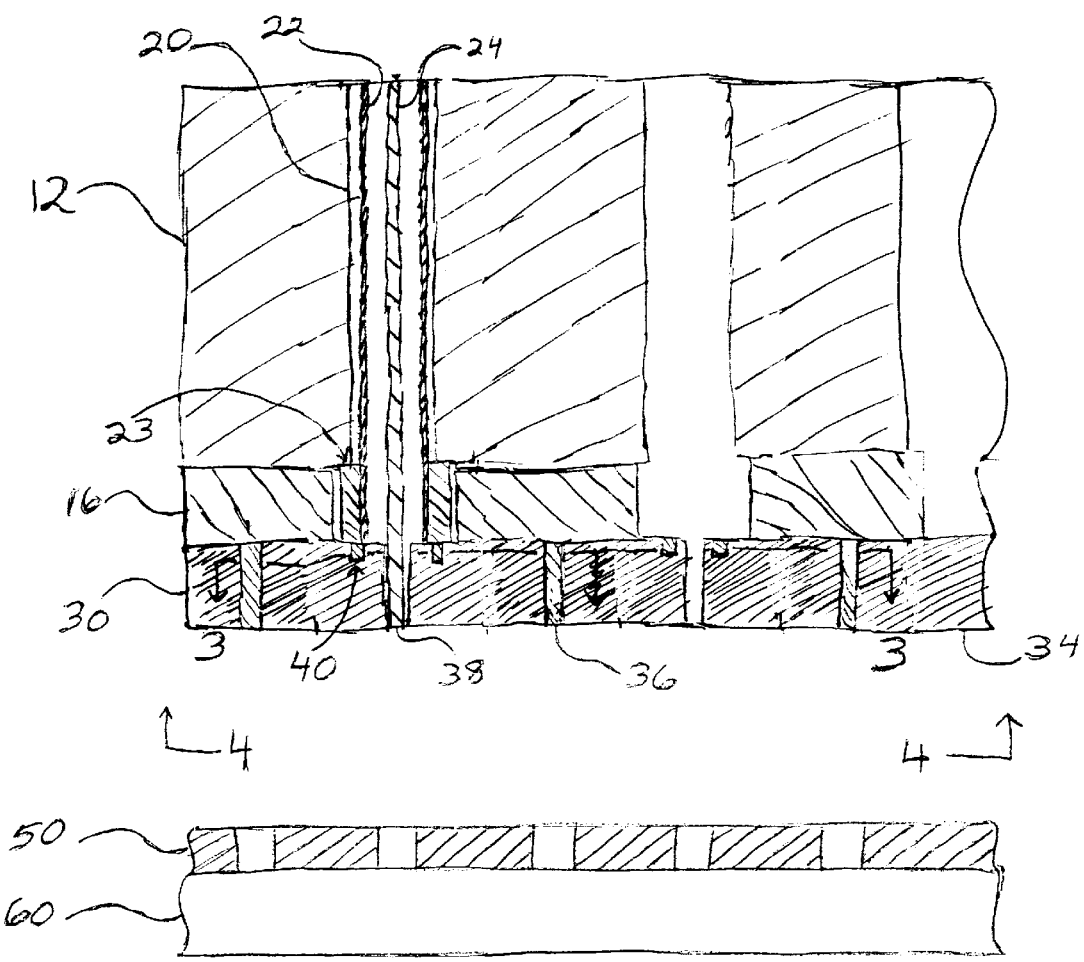
FIG. 2 is a partial cross-sectional view of an assembled interface module along line 2—2 of FIG. 1.

With reference to FIGS. 1 and 2, the stiffener 12 comprises a rectangular conductive body formed with an array of through-bores 14. The throughbores are formed to receive the coaxial cables 20 on a one-to-one basis. Preferably, the coaxial cables are of the ultra-miniature 50 ohm variety, allowing the throughbores to be of a relatively high-density center to center pitch, such as 0.120 inches apart.

The top side 17 of a conductive thin epoxy wafer 16 bonds to the bottom surface of the stiffener 12 and includes formed open-ended paths 19 that correspond in alignment to the stiffener through-bores 14 for nesting a portion of the distal end of each cable 20. More specifically, the wafer serves as a signal path return plane that forms a connection with each shield conductor 22 through a press-fit ferrule 23 (FIG. 2). The bottom side 19 of the wafer 16 bonds to the signal transition assembly 30.

In a preferred embodiment, the signal transition assembly 30 comprises a printed circuit board (PCB) substrate having opposite conductive surface layers (copper, for example) plated onto a layer of Kapton material. The surface layers define respective bonding and engagement surfaces 32 and 34. The board is formed with ground vias 36 (FIG. 2) that interconnect with the epoxy wafer bottom surface 19 to pass the signal return from the shield conductors 22 to the substrate engagement surface 34 in a 50-ohm pattern. Drilled and plated signal conductor paths 38 receive the distal tip of each cable center conductor 24 for soldering. By mounting the tip of each cable center conductor into the substrate, and fixing the shield conductor 22 to the wafer/stiffener assembly, relative axial displacement, or pistoning, is prevented.

A critical consideration in the positioning of the ground 36 and signal 38 vias into the substrate 30 involves maintaining a 50 ohm environment vertically through the board. This is straightforward in a coaxial cable, where the shield continuously surrounds the center conductor. The problem is not so simple to solve when transitioning from a coaxial cable to a PCB.

The inventors have discovered that by positioning the ground vias 36 around the signal via 38 in a precise alignment, a 50-ohm structure is realized. For a configuration of four ground vias to one signal via grouping, the ground vias circumscribe an oval having a first radius of approximately 0.060 inches and a second radius of approximately 0.104 inches. Depending on the respective via diameters, and other factors, many different configurations are possible to achieve an approximate 50-ohm structure.

Figure 3:
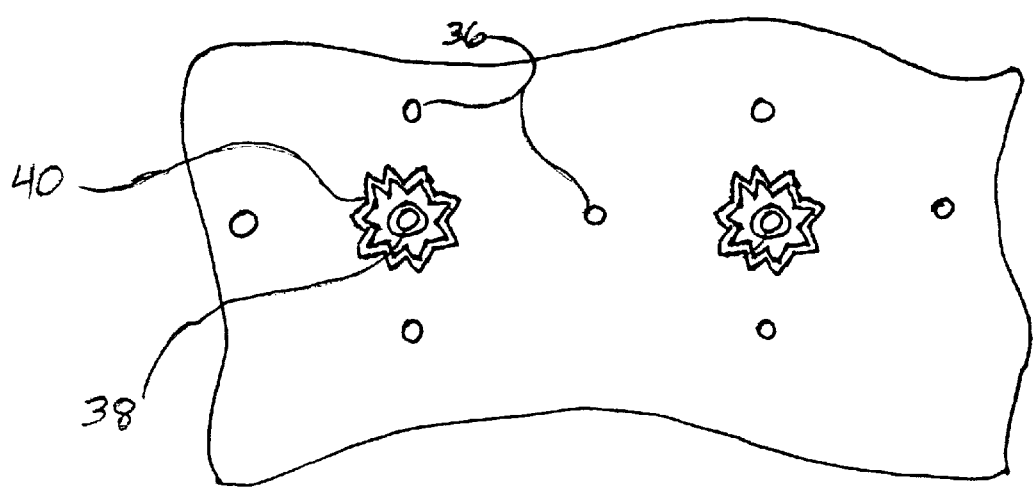
FIG. 3 is a partial cross-sectional view of the transition assembly along line 33 of FIG. 2.

Because the engagement surface 34 of the interface module comprises a PCB substrate, forming surface structures on the board through plating and etching techniques is straightforward and relatively inexpensive. In particular, the inventors have taken opportunity of the PCB nature of the substrate to form electro-static-discharge (ESD) suppressive structures 40 (FIG. 3) for receiving an ESD suppression polymer. As shown more clearly in FIG. 3, each structure is formed into a star-shaped configuration with a 4-mil gap and disposed radially between the signal and the signal path return plane vias 38 and 36. This shape provides optimum ESD suppression capability. By screening ESD suppression structures, the high-cost pin electronics channel cards are more protected from damaging inadvertent electro-static voltage spikes.

Fabricating the interface module 10 involves first forming the substrate 30. This is accomplished by first selecting a suitable 0.025 to 0.030 inch thick, double-sided board, such as Kapton, with half-ounce copper deposited on both sides. Holes are then drilled in the board for termination of the cable signal conductors 24 and ground vias 36. The signal holes 38 are plated to form vias, while a conductive fill material is inserted into the ground holes. Etching of the bonding side of the board is then performed to form the ESD-suppression structures 40, forming 4-mil wide grooves around each signal via. The ESD polymer is then screened into the star-shaped grooves, and cured.

The opposite side of the board (the engagement side) 34 is then plated with additional copper to provide an approximately 10 mil thick layer. The signal holes 38 are re-drilled to a 0.025 inch diameter for insertion of the cable signal conductor tips 24. The holes may then be tin plated to improve the solderability of the cable signal conductor to the board. At this point, the stiffener/wafer assembly is bonded to the PCB 30. The cables are then inserted into the stiffener, and the signal conductors 24 soldered. Press-fit ferrules 23 (FIG. 2) create an interference fit ground connection between the shield conductor 22 for each cable 20, and the epoxy wafer 16.

Figure 4:
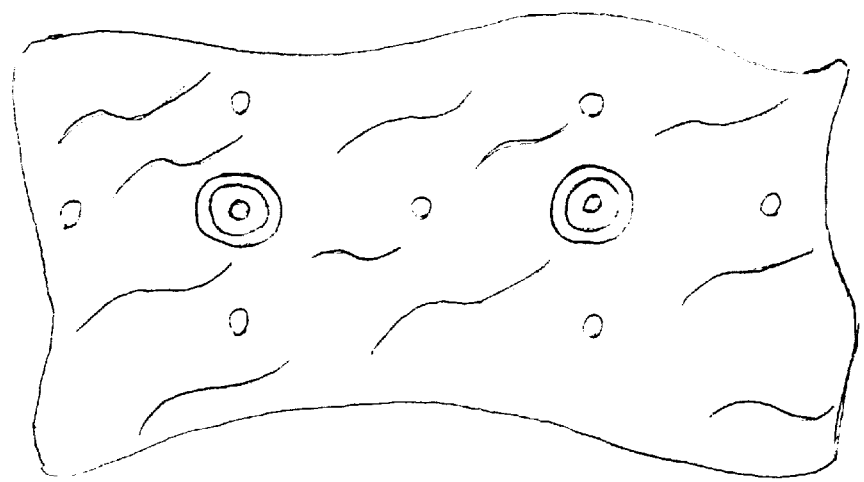
FIG. 4 is a partial view of the transition assembly along line 4—4 of FIG. 2.

After the signal conductors 24 are installed and soldered, the engagement end 34 of the board 30 is milled to the desired flatness. Gold is then plated to the ground and signal contact points. FIG. 4 illustrates the engagement or interposer side of the board.

When the assembly is complete, the interposer side 34 will have signal pads and the ground plane showing (FIG. 4). The ground vias 36 will all be conductively filled and then plated over to make a solid ground plane. This increases the strength of the ground plane so that an interposer can be mated to this surface without damage to the through-hole via if an interposer contact lands directly on the via hole. The final assembly creates a very robust and reliable PCB-to-PCB interface that can be used with any interposer structure that meets the pitch of the signal pins and electrical performance.

In operation, the interface module 10 effects a connection between the outputs of one or more channel cards (with several channels' worth of electronics, not shown) to an interposer 50 (FIG. 2). The interposer, in-turn, serves as an intermediate compliant, 50-ohm connector to a device-interface-board (DIB) 60 (FIG. 2) that routes the channel signal paths to the device-under-test pins (not shown).

Tester signals propagating from the channel card outputs (not shown) along the transmission lines (established by the coaxial cables) undertake a cable-to-board transition at the interface module substrate 30. Because of the geometry of the ground vias 36 with respect to each signal via 38, the transition contributes little degradation to the transmission line in the form of mismatching impedance. This optimizes the fidelity of the tester signal, contributing to overall high-accuracy in edge-placement and timing for the device-under-test.

Those skilled in the art will appreciate the many benefits and advantages afforded by the present invention. In particular, funneling large arrays of conductors from a low-density array to a high-density array may be easily accomplished by a low-cost and highly manufacturable method. Additionally, by enabling the use of true 50-ohm transmission lines with low dielectrics as signal conductors as opposed to microstrip traces that simulate transmission lines to certain limits, signal fidelity is maximized over a wide bandwidth passing beyond several gigahertz.

While the invention has been particularly shown and described with reference to the preferred embodiments thereof, it will be understood by those skilled in the art that various changes in form and detail may be made therein without departing from the spirit and scope of the invention.

What is claimed is:

1. An interface module for connecting a plurality of signal paths from a first electronic assembly to a second electronic assembly, the interface module including:
   a plurality of coaxial cables having distal ends adapted for coupling to the first electronic assembly and having proximal ends, each cable having a shield conductor and a center conductor;
   a stiffener formed with a plurality of throughbores for receiving the proximal ends of the plurality of signal cables, the stiffener having a flat termination side at one end of the plurality of throughbores; and
   a flat substrate bonded to the stiffener termination side, the substrate having respective opposite planar surfaces and formed with spaced-apart signal paths and ground paths extending transversely from one planar surface to the other planar surface, each center conductor and shield conductor electrically coupled to the signal paths and ground paths, the center conductor mounted to the flat substrate to minimize relative axial displacement with respect to the shield conductor.

2. An interface module according to claim 1 and further including:
   a flat conductive wafer for bonding the substrate to the stiffener.

3. An interface module according to claim 2 wherein:
   the conductive wafer defines a ground plane;
   the shield conductors are mounted to the conductive wafer; and
   the signal conductors are mounted to the substrate.

4. An interface module according to claim 1 wherein:
   one of the planar surfaces of the substrate is formed with a plurality of star-shaped grooves, each groove disposed coaxially with a signal path, each groove filled with an ESD polymer.

5. An interface module according to claim 1 wherein:
   each substrate signal path is grouped with a plurality of ground paths, the group of signal and ground paths forming a fifty-ohm structure.

6. An ATE interface for coupling high-frequency tester channels to a device-under-test, the interface including:
   an interface module including
      a plurality of coaxial cables having distal ends adapted for coupling to the first electronic assembly and proximal ends, each cable having a shield conductor and a center conductor;
      a stiffener formed with a plurality of throughbores for receiving the proximal ends of the plurality of signal cables, the stiffener having a flat termination side at one end of the plurality of throughbores; and
      a flat substrate bonded to the stiffener termination side, the substrate having respective opposite planar surfaces and formed with spaced-apart signal paths and ground paths extending from one planar surface to the other planar surface, each center conductor and shield electrically coupled to the signal paths and ground paths, each center conductor mounted to the flat substrate to minimize relative axial displacement with respect to the shield conductor;
   a device-interface-board adapted for mounting the device-under-test; and
   an interposer disposed between the signal transition assembly and the device-interface-board.

7. An ATE interface according to claim 6 and further including:
   a flat conductive wafer for bonding the substrate to the stiffener.

8. An ATE interface according to claim 7 wherein:
   the flat conductive wafer defines a ground plane;
   the shield conductors are mounted to the flat conductive wafer; and
   the signal conductors are mounted to the substrate.

9. An ATE interface according to claim 6 wherein:
   one of the planar surfaces of the substrate is formed with a plurality of star-shaped grooves, each groove disposed coaxially with a signal path, each groove filled with an ESD polymer.

10. An ATE interface according to claim 6 wherein:
    each substrate signal path is grouped with a plurality of ground paths, the group of signal and ground paths forming a fifty-ohm structure.

11. An interface module for connecting a plurality of signal paths from a first electronic assembly to a second electronic assembly, the interface module including:
    a plurality of coaxial cables having distal ends adapted for coupling to the first electronic assembly and proximal ends, each cable having a shield conductor and a center conductor;
    a stiffener formed with a plurality of throughbores for receiving the proximal ends of the plurality of signal cables, the stiffener having a flat termination side at one end of the plurality of throughbores; and
    means for minimizing relative axial displacement between the shield conductor and the center conductor, the means for minimizing including a flat substrate bonded to the stiffener termination side, the substrate having respective opposite planar surfaces and formed with spaced-apart signal paths and ground oaths extending transversely from one planar surface to the other planar surface, each center conductor and shield conductor electrically coupled to the signal paths and ground paths, each center conductor mounted perpendicularly to the flat substrate to minimize relative axial displacement with respect to the shield conductor.

12. An ATE interface according to claim 11 and further including:
    means for bonding the substrate to the stiffener.

13. An ATE interface according to claim 12 wherein the means for bonding includes a flat conductive wafer.

14. An ATE interface according to claim 13 wherein:
    the flat conductive wafer defines a ground plane;
    the shield conductors are mounted to the flat conductive wafer; and
    the signal conductors are mounted to the substrate.

15. An ATE interface according to claim 11 wherein:
    one of the planar surfaces of the substrate is formed with a plurality of star-shaped grooves, each groove disposed coaxially with a signal path, each groove filled with an ESD polymer.

16. An ATE interface according to claim 11 wherein:
    each substrate signal path is grouped with a plurality of ground paths, the group of signal and ground paths forming a fifty-ohm structure.

17. A method of manufacturing a semiconductor device, the semiconductor device disposed on a device-interface-board, the method including the steps:
    selecting a semiconductor tester to test the semiconductor device;

interfacing the semiconductor tester to the device-interface-board, the interfacing step including the steps selecting an interface module having
- a plurality of coaxial cables having distal ends adapted for coupling to the first electronic assembly and proximal ends, each cable having a shield conductor and a center conductor;
- a stiffener formed with a plurality of throughbores for receiving the proximal ends of the plurality of signal cables, the stiffener having a flat termination side at one end of the plurality of throughbores; and
- a flat substrate bonded to the stiffener termination side, the substrate having respective opposite planar surfaces and formed with spaced-apart signal paths and ground paths extending transversely from one planar surface to the other planar surface, each center conductor and shield electrically coupled to the signal paths and ground paths, the center conductor mounted to the flat substrate to minimize relative axial displacement;

interposing a compliant interconnect between the interface module and the device-interface-board; and testing the semiconductor device with the semiconductor tester.

* * * * *